(12) United States Patent
Frulio (10) Patent No.: US 11,328,752 B2
(45) Date of Patent: May 10, 2022

(54) SELF-TIMED SENSING ARCHITECTURE FOR A NON-VOLATILE MEMORY SYSTEM

(71) Applicant: Silicon Storage Technology, Inc., San Jose, CA (US)

(72) Inventor: Massimiliano Frulio, Milan (IT)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 17/095,331

(22) Filed: Nov. 11, 2020

(65) Prior Publication Data

US 2021/0366522 A1 Nov. 25, 2021

Related U.S. Application Data

(60) Provisional application No. 63/027,472, filed on May 20, 2020.

(51) Int. Cl.
  *G11C 7/06* (2006.01)
  *G11C 7/10* (2006.01)
  *H03K 19/21* (2006.01)
  *G11C 7/22* (2006.01)

(52) U.S. Cl.
  CPC ............. *G11C 7/06* (2013.01); *G11C 7/1045* (2013.01); *G11C 7/1051* (2013.01); *G11C 7/222* (2013.01); *H03K 19/21* (2013.01)

(58) Field of Classification Search
  CPC ........................................................ G11C 7/06
  USPC ..................................................... 365/185.21
  See application file for complete search history.

(56) References Cited

U.S. PATENT DOCUMENTS

| | | | | |
|---|---|---|---|---|
| 7,342,819 B2* | 3/2008 | Liaw | ......................... | G11C 7/14 365/148 |
| 7,477,559 B2* | 1/2009 | Taddeo | ..................... | G11C 7/02 365/191 |
| 8,867,260 B2* | 10/2014 | Huang | .................. | G11C 13/004 365/148 |
| 9,613,692 B1* | 4/2017 | Pasotti | ............... | G11C 13/0028 |
| 2002/0002653 A1 | 1/2002 | Lakhani | | |
| 2004/0202014 A1 | 10/2004 | Palmer et al. | | |
| 2006/0023555 A1* | 2/2006 | Morishima | .......... | G11C 7/1066 365/230.03 |
| 2014/0003160 A1* | 1/2014 | Trivedi | ................... | G11C 7/065 365/189.02 |

(Continued)

FOREIGN PATENT DOCUMENTS

| TW | 200639872 A | 11/2006 |
|---|---|---|
| TW | 201225097 B | 6/2012 |

(Continued)

OTHER PUBLICATIONS

Taiwanese Office Action and Search Report dated Feb. 25, 2022 corresponding to the counterpart Taiwanese Patent Application No. 110117189.

*Primary Examiner* — Muna A Techane
(74) *Attorney, Agent, or Firm* — DLA Piper LLP (US)

(57) ABSTRACT

A self-timed sensing architecture for reading a selected cell in an array of non-volatile cells is disclosed. The sensing circuitry generates a signal when a stable sensing value has been obtained from the selected cell, where the stable sensing value indicates the value stored in the selected cell. The signal indicates the end of the sensing operation, causing the stable sensing value to be output as the result of the read operation.

8 Claims, 9 Drawing Sheets

(56) References Cited

U.S. PATENT DOCUMENTS

| | | |
|---|---|---|
| 2014/0269124 A1 | 9/2014 | Senigen |
| 2017/0178742 A1* | 6/2017 | Qiu ........................ G11C 17/16 |
| 2017/0249976 A1 | 8/2017 | Bringivijayaraghavan |
| 2019/0108872 A1* | 4/2019 | Gupta ................... G11C 11/419 |

FOREIGN PATENT DOCUMENTS

| | | |
|---|---|---|
| TW | 201248627 A | 12/2012 |
| TW | 201514992 A | 4/2015 |
| TW | 201523614 A | 6/2015 |
| TW | 201530556 A | 8/2015 |
| TW | 201822204 A | 6/2018 |

\* cited by examiner

SELF-TIMED SENSING ARCHITECTURE FOR A NON-VOLATILE MEMORY SYSTEM

PRIORITY CLAIM

This application claims priority to U.S. Provisional Patent Application No. 63/027,472, filed on May 20, 2020, and titled, "Self-Timed Sensing Architecture for a Non-Volatile Memory System," which is incorporated by reference herein.

FIELD OF THE INVENTION

A self-timed sensing architecture for reading a selected cell in an array of non-volatile cells is disclosed. The sensing circuitry generates a signal when a stable sensing value has been obtained from the selected cell, where the stable sensing value indicates the value stored in the selected cell. The signal indicates the end of the sensing operation, causing the stable sensing value to be output as the result of the read operation.

BACKGROUND OF THE INVENTION

In non-volatile memory systems, a read operation is used to determine the data value that has been stored in a selected memory cell. This requires the use of a sensing circuit, which "senses" the value stored in a selected memory cell, often by comparing current drawn by the cell against a reference current or against current drawn by a reference cell. This operation involves a sequence of timed events that have the goal of converting the analog information stored in the selected memory cell into a digital output.

In the prior art, read timing is implemented by a timer that tries to match the actual read duration. However, actual read duration of different selected memory cells in an array can have a wide variation due to differences in voltage supplies, operating temperature, semiconductor process, and cell current. As a result, the read timer design needs sufficient margin to accommodate these variations. Read speed in the prior art therefore is slower than its actual capability. Power consumption is increased because of the longer than needed read duration.

Figure 1:
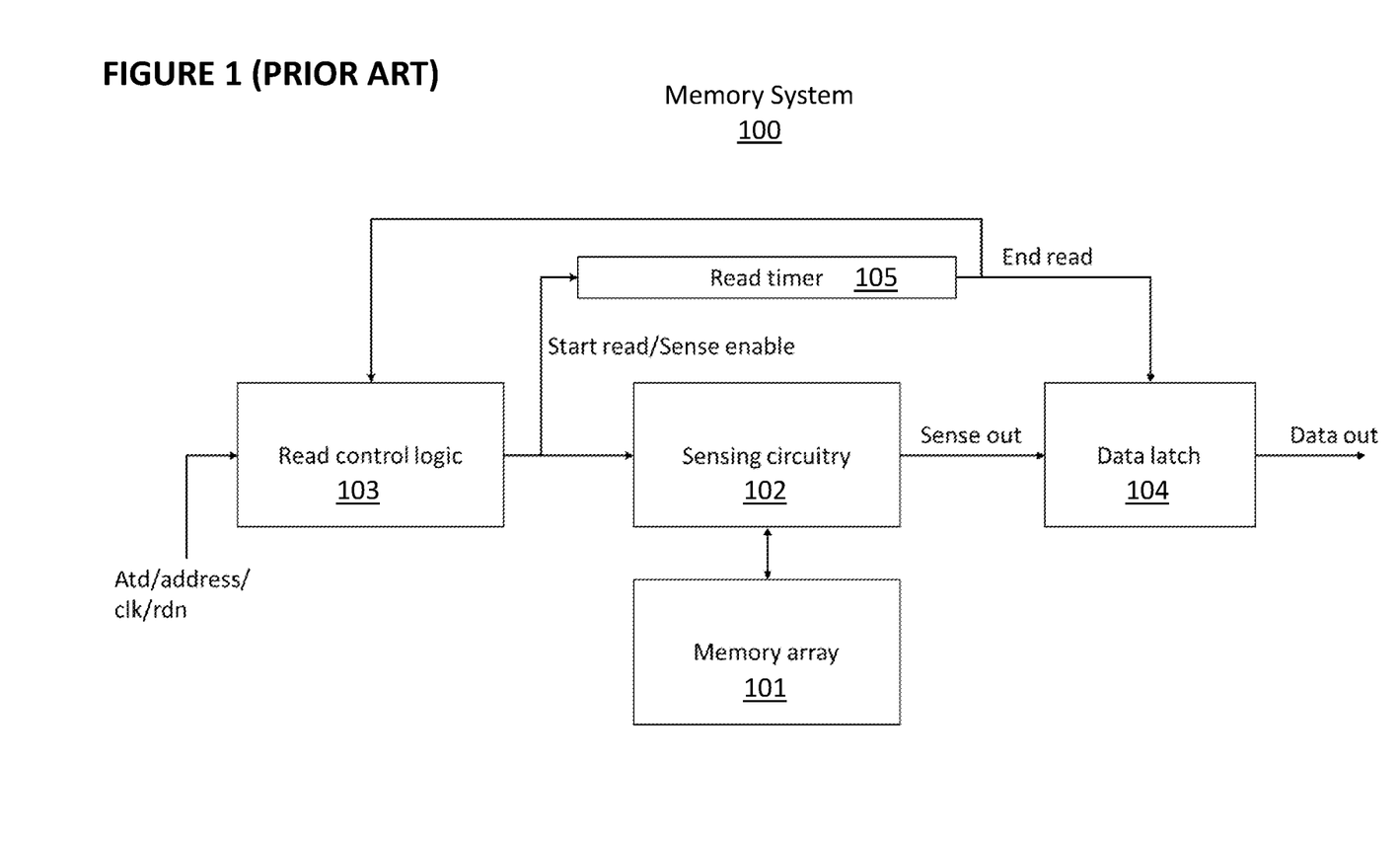
FIG. 1 depicts a prior art memory system.

FIG. 1 depicts the read portion of prior art memory system 100. Read control logic 103 receives the address for the read operation, an address transition detection signal (Atd), a clock signal (clk), and a read enable signal (rdn), some combination of which controls the enabling of sensing circuitry 102 and read timer 105 in parallel through the signal labeled "Start read/Sense enable" output by the read control logic 103. Read timer 105 defines the read duration and latches the sense status (labeled "Sense out") of a selected cell in memory array 101 in data latch 104 after a given predefined delay using the signal labeled "End read." The digital output of data latch 104 is indicative of the value that was read in the selected cell of memory array 101 by sensing circuitry 102. Latching the data too early can lead to a read failure, whereas latching the data late leads to poor performance. The read duration implemented by read timer 105 is determined during the design phase and incorporates the wide margin discussed above.

Prior art memory system 100 is inefficient because the read duration imposed by read timer 105 is necessarily more than is needed due to the factors described above.

One prior art effort to overcome these challenges is to perform calibration trimming on a die by die basis during the wafer sort phase of the manufacturing process. However, this adds significant time and cost to the manufacturing process. Moreover, the trimming is done in one environmental setting with a certain temperature and a certain voltage supply, so some margin still needs to be included in the design of read timer 105 to accommodate the temperature and voltage supply variations that will be experienced in field operations.

What is needed is an improved system for reading a selected cell in a non-volatile memory array. Specifically, a system is needed with improved read timing that also minimizes power consumption and preferably that does not require calibration trimming during the manufacturing process.

SUMMARY OF THE INVENTION

A self-timed sensing architecture for reading a selected cell in an array of non-volatile cells is disclosed. The sensing circuitry generates a signal when a stable sensing value has been obtained from the selected cell, where the stable sensing value indicates the value stored in the selected cell. The signal indicates the end of the sensing operation, causing the stable sensing value to be output as the result of the read operation.

DETAILED DESCRIPTION OF THE INVENTION

Figure 2:
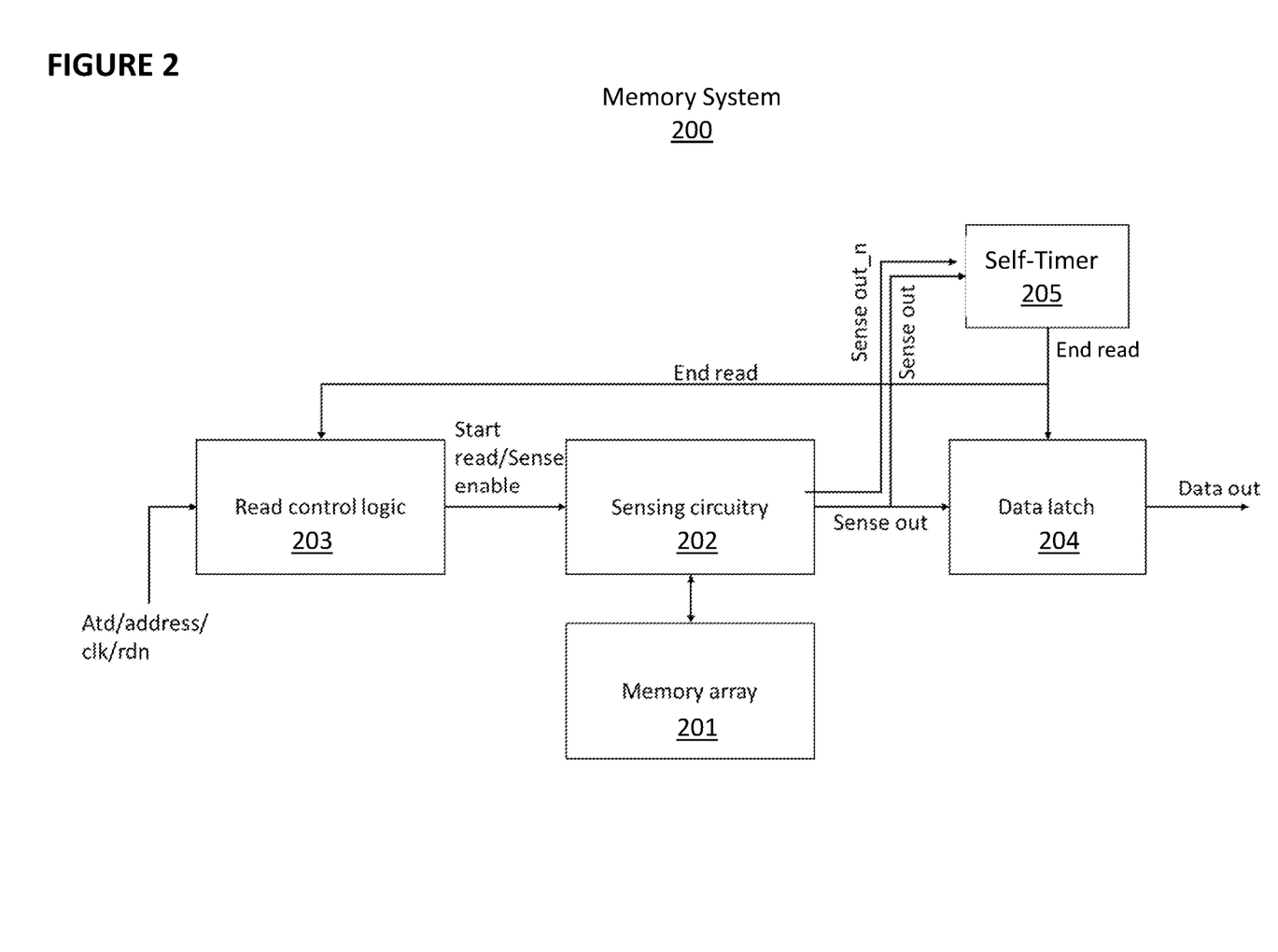
FIG. 2 depicts an embodiment of a memory system according to certain embodiments.
Figure 3:
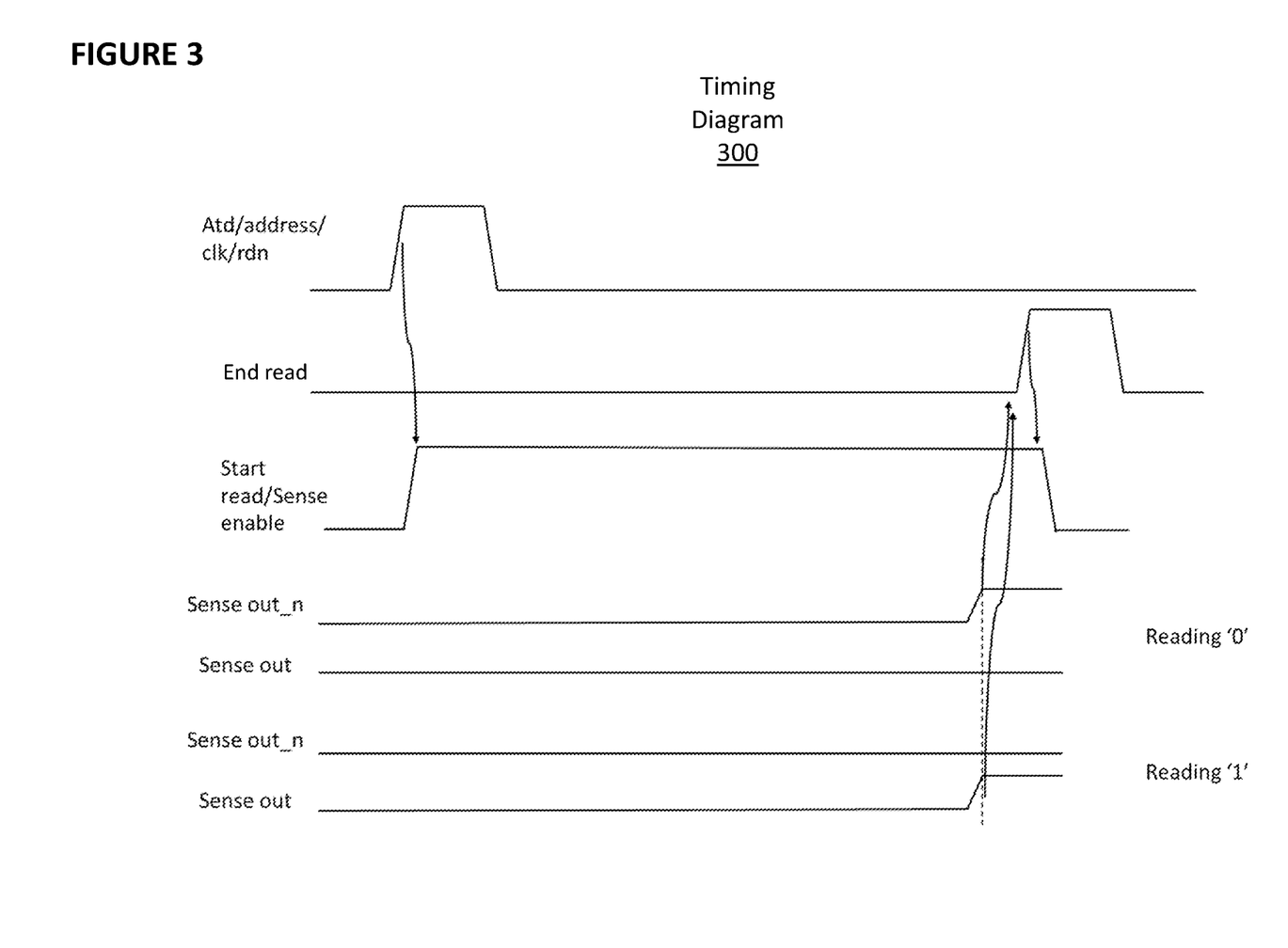
FIG. 3 depicts a timing diagram of a read operation using the memory system of FIG. 2.

FIG. 2 depicts memory system 200, which comprises memory array 201, sensing circuitry 202, read control logic 203, data latch 204, and self-timer 205. FIG. 3 depicts a timing diagram 300 for a typical read operation performed by memory system 200.

With reference to both FIGS. 2 and 3, read control logic 203 receives the address for the read operation, an address transition detection signal (Atd), a clock signal (clk), and a read enable signal (rdn), some combination of which controls the enabling of sensing circuitry 202 through the signal labeled "Start read/Sense enable" (SA_EN) output by the read control logic 203. Sensing circuitry 202 provides a first output labeled "Sense out" to data latch 204 and to self-timer 205, and a second output labeled "Sense out_n" to self-timer 205. When signal Start read/Sense enable is set to active (shown as active high) by read control logic 203, sensing circuitry 202 becomes active.

In the initial phase of the reading operation, both Sense out and Sense out_n are equal to "0" as both signals are not stable at that point in time as internal signals driving Sense out and Sense out_n are initialized at 0V. If the selected cell in memory array 201 contains a "1," then Sense out will go to a "1" value and Sense out_n will stay at "0." If the selected cell contains a "0" then Sense out_n will go to a "1" value, while Sense out will stay at "0". Sense out_n and Sense out thus will be at opposite values as soon as those signals have reached a stable state.

In the alternative, Sense out and Sense out_n can be initialized to "1" at Vdd instead of "0." If the selected cell in memory array 201 contains a "1," then Sense out will remain at a "1" value and Sense out_n will go to "0." If the selected cell contains a "0" then Sense out_n will remain at a "1" value, while Sense out will go to "0". Sense out_n and Sense out thus will be at opposite values as soon as those signals have reached a stable state.

Self-timer 205 in one embodiment is implemented with XOR logic and receives Sense out and Sense out_n. The XOR logic initially outputs a "0" when Sense out and Sense out_n are both at "0," and outputs a "1" when either Sense out or Sense out_n goes to a "1" in response to the value stored in the selected cell of memory array 201, which is shown as the control signal labeled "End read" in FIGS. 2 and 3. When this happens, the "1" output by the XOR logic of self-timer 205 will trigger data latch 204, which will latch the Sense out signal output by sensing circuity 202 and present it as the final output, Data out, in digital form that indicates the value stored in the selected cell of memory array 201. At this point, the read operation is complete, and the sense amplifiers in sensing circuitry 202 can be turned off, by disabling signal SE_EN, resulting in power savings compared to the prior art.

Figure 4:
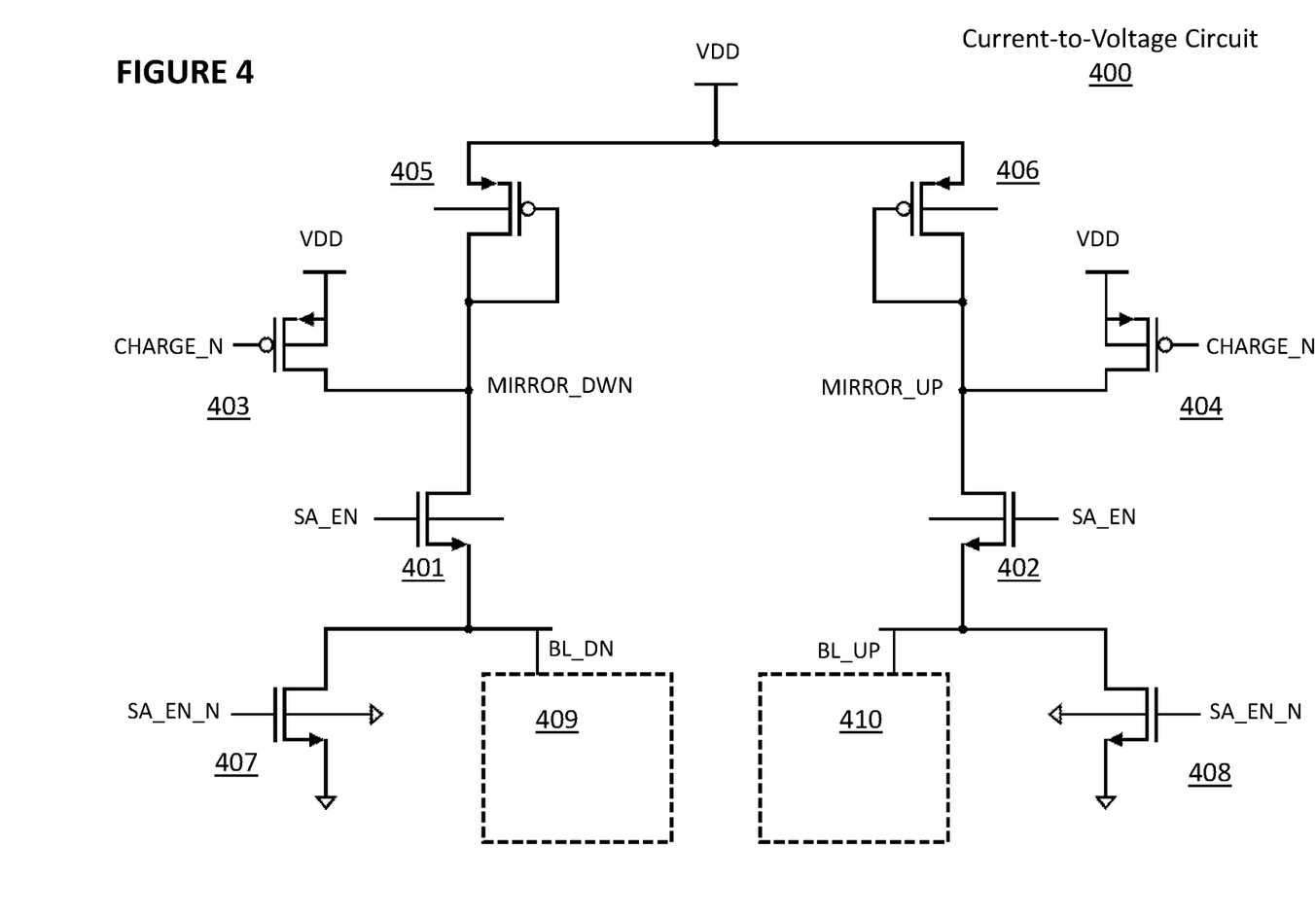
FIG. 4 depicts a current-to-voltage circuit.
Figure 5:
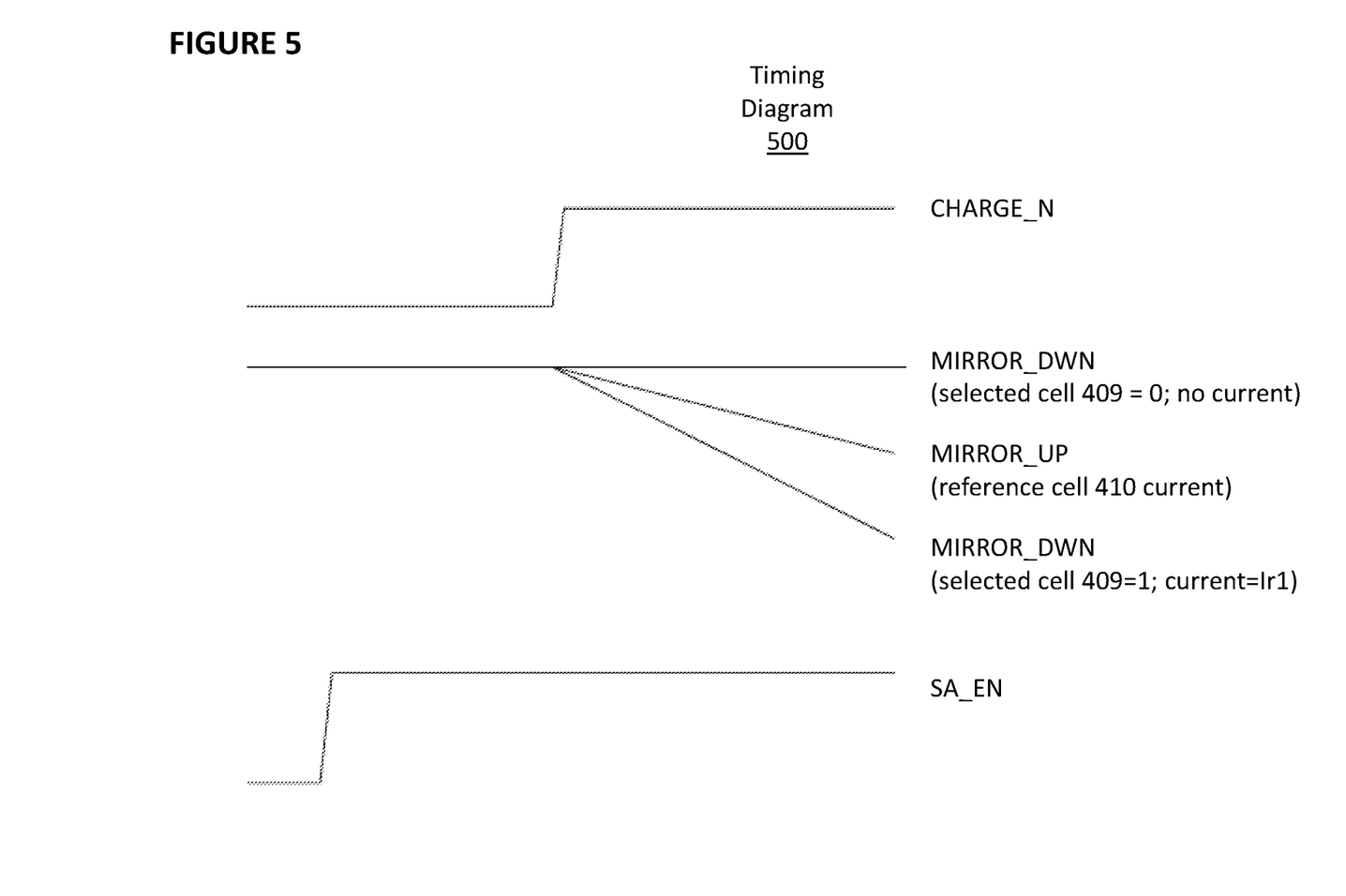
FIG. 5 depicts a timing diagram of the current-to-voltage circuit of FIG. 4.
Figure 6:
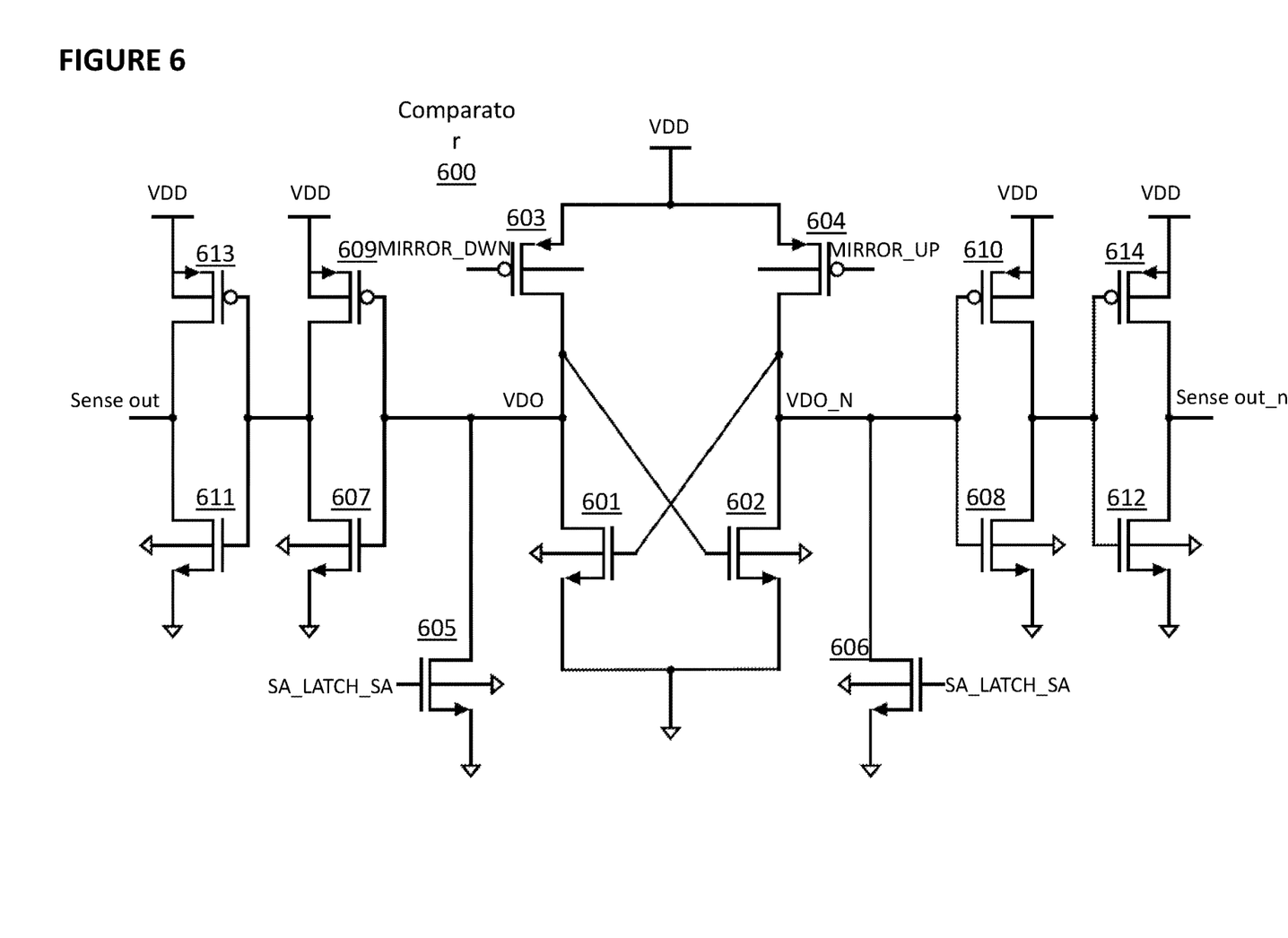
FIG. 6 depicts a comparator.

FIGS. 4, 5, and 6 depict additional detail for an embodiment of sensing circuitry 202.

FIG. 4 depicts current-to-voltage circuit 400, which is part of sensing circuitry 202. Current-to-voltage circuit 400 comprises NMOS transistors 401, 402, 407, and 408 and PMOS transistors 403, 404, 405, and 406, configured as shown. The gates of NMOS transistors 401 and 402 are driven by the sense enable signal "SA_EN" generated by read control logic 203, and the gates of NMOS transistors 407 and 408 are driven by the inverse of the SA_EN signal, "SA_EN_N", generated by read control logic 203. The gates of PMOS transistors 403 and 404 are driven by a signal "CHARGE_N" generated by read control logic 203, which generates CHARGE_N by performing a logic operation on address transition detection signal Atd and signal SA_EN. NMOS transistor 401 is coupled to selected memory cell 409 in memory array 201 through the bit line labeled "BL_DWN,", and NMOS transistor 402 is coupled to reference memory cell 410, which can be located in memory array 201 or in a separate, reference memory array, through the bit line labeled "BL_UP". In the alternative, the roles of selected memory cell 409 and reference memory cell 410 can be reversed (meaning that cell 409 becomes the reference memory cell and cell 410 becomes the selected memory cell), which might be useful, for example, if the location of a selected memory cell changes to a different bank of memory cells.

Selected memory cell 409 draws zero current when it stores a "0" value, and it draws a current Ir1 when it stores a "1" value. Reference memory cell 410 is programmed to draw a predetermined current between 0 and Ir1, such as 0.5*Ir1, during a read operation.

During a read operation, transistors 401, 402, 403, and 404 are turned on by the signals SA_EN being set to a high level and CHARGE_N being set to a low level, depicted in FIG. 5, and as a result, the nodes MIRROR_DWN and MIRROR_UP are pre-charged to a certain voltage near the supply voltage VDD through PMOS transistor 403, 404, respectively. The time difference between SA_EN being set to the high level and CHARGE_N being set to the low level is responsive to the Atd pulse duration, or a derivative thereof. NMOS transistors 407, 408 are held off by signal SA_EN_N. PMOS transistors 403 and 404 are then turned off by signal CHARGE_N being set to a high level, and the sensing phase begins.

Selected memory cell 409 and reference memory cell 410 draw current in amounts that reflect the values stored in each one. This causes the gates of PMOS transistors 405 and 406 (connected to nodes "MIRROR_DWN" and "MIRROR_UP," respectively) to discharge. If selected memory cell 409 is in a "1" state, the node MIRROR_DWN will discharge faster than the node MIRROR_UP. If selected memory cell 409 is in a "0" state, the node MIRROR_UP will discharge faster than the node MIRROR_DWN. FIG. 5 depicts the voltage of nodes MIRROR_DWN and MIRROR_UP in the situations where selected memory cell 409 contains a "0" and where it contains a "1".

In FIG. 6, sensing circuitry 202 further comprises comparator 600. Comparator comprises NMOS transistors 601, 602, 605, 606, 607, 608, 611, and 612 and PMOS transistors 603, 604, 609, 610, 613, and 614, configured as shown. Node MIRROR_DWN from FIG. 4 is connected to the gate of PMOS transistor 603, and node MIRROR_UP from FIG. 4 is connected to the gate of PMOS transistor 604, such that PMOS transistor 405 in FIG. 4 and PMOS transistor 603 in FIG. 6 form one current mirror, and PMOS transistor 406 in FIG. 4 and PMOS transistor 604 in FIG. 6 form another current mirror. NMOS transistors 601 and 602 are connected to form a half-latch. The nodes VDO and VDO_N are initially set to 0 V through respective pull-down transistors 605 and 606 through a signal SA_LATCH_SA, generated by read control logic 203, that has the same timing of CHARGE_N in FIG. 5, but opposite in phase, which are turned off once the sensing phase begins. In an alternative embodiment, signal SA_LATCH_SA is generated by sensing circuitry 202 responsive to signal CHARGE_N.

If selected memory cell 409 is in a "1" state, the node VDO will be pulled up to the supply voltage VDD faster than the node VDO_N because the node MIRROR_DWN will discharge faster than the node MIRROR_UP. If selected memory cell 409 is in a "0" state, the node VDO_N will be pulled up to the supply voltage VDD faster than the node VDO because the node MIRROR_UP will discharge faster than the node MIRROR_DWN.

The first of VDO and VDO_N to be pulled up to VDD will cause the other node to be discharged by toggling the half latch state of NMOS transistors 601 and 602.

Transistor pairs 607 and 609, 611 and 613, 608 and 610, and 612 and 614 each form an inverter. The output of comparator 600 is Sense Out and Sense Out_n.

Figure 7:
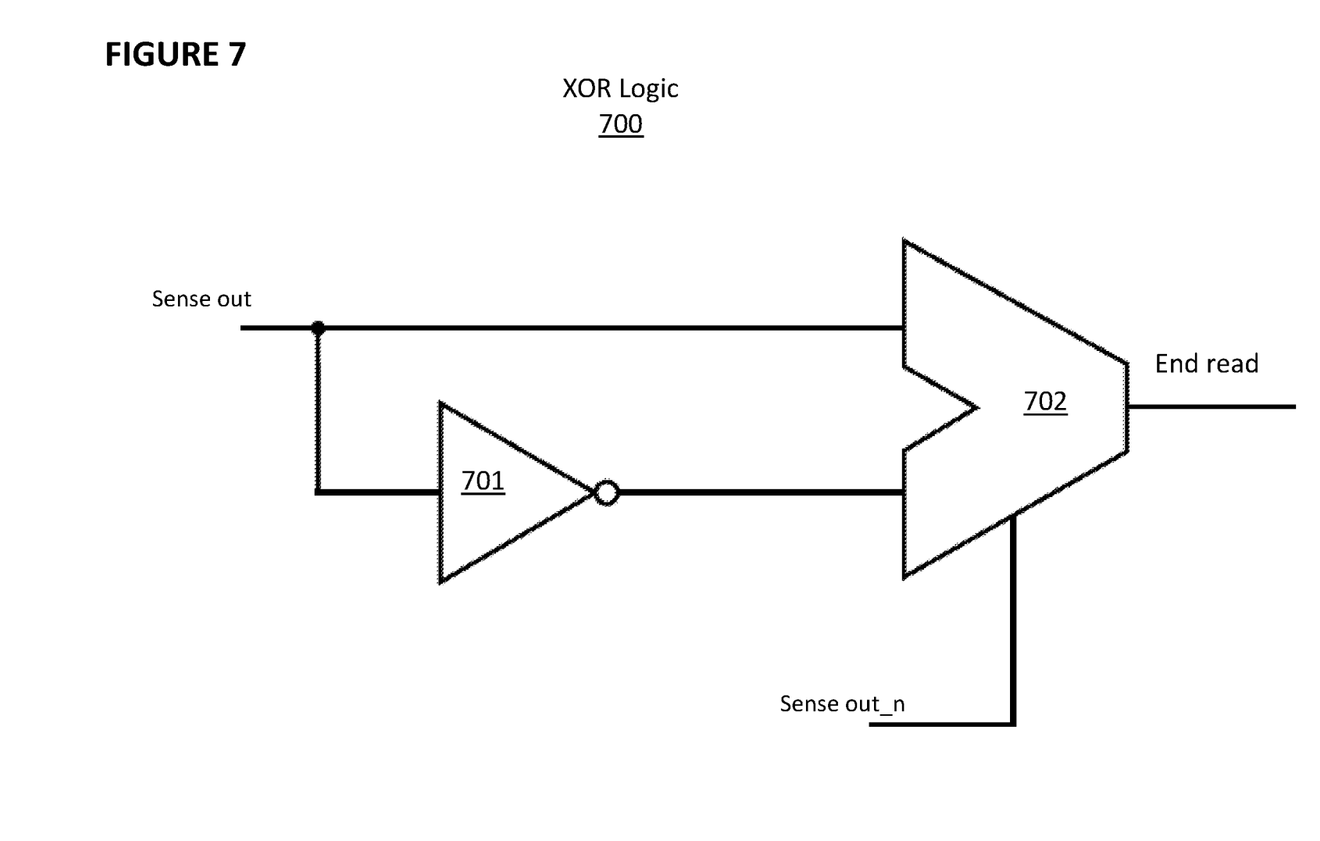
FIG. 7 depicts one embodiment of a self-timer.
Figure 8:
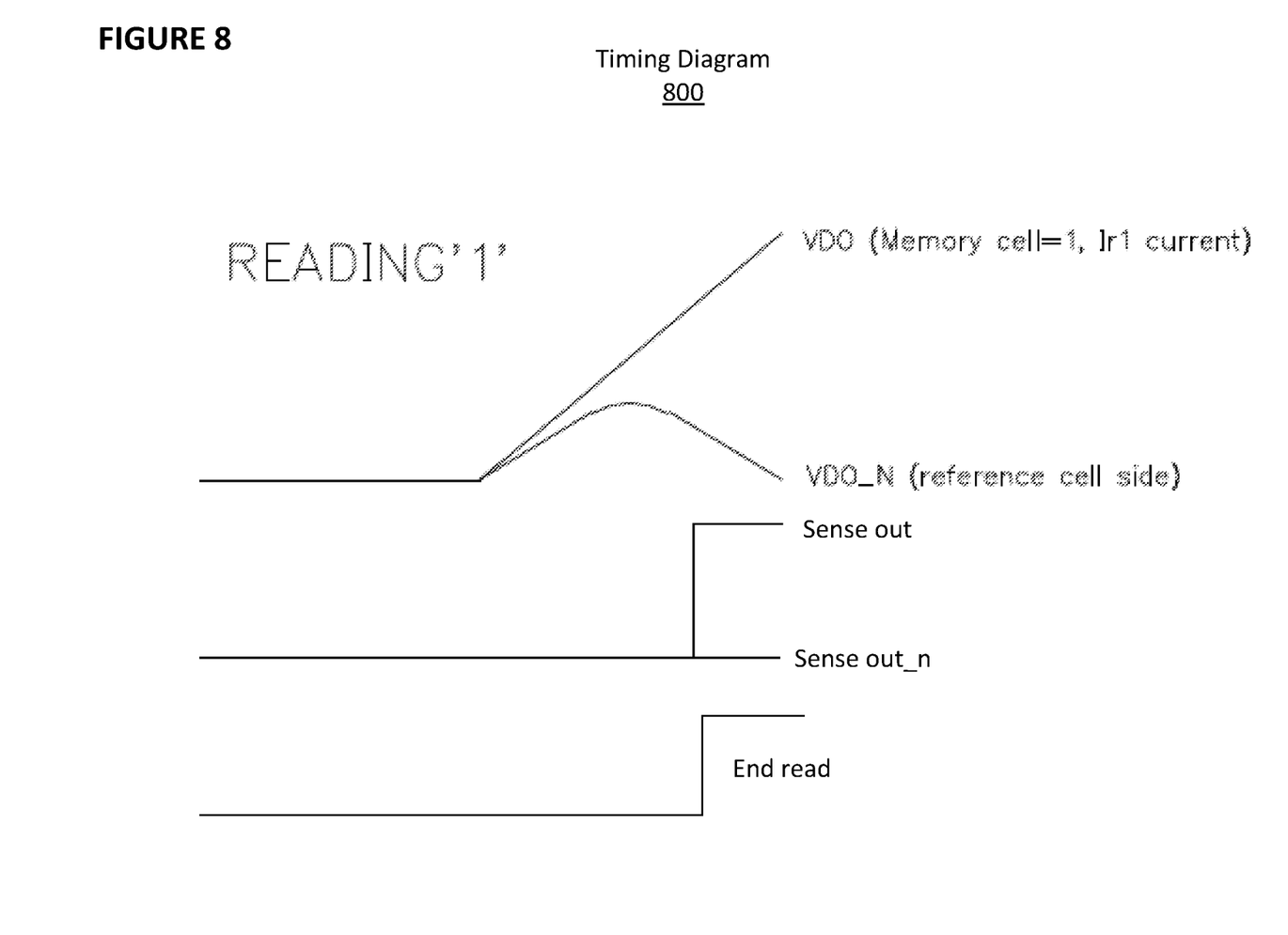
FIG. 8 depicts a timing diagram of the system of FIGS. 6A, 6B, and 7.
Figure 9:
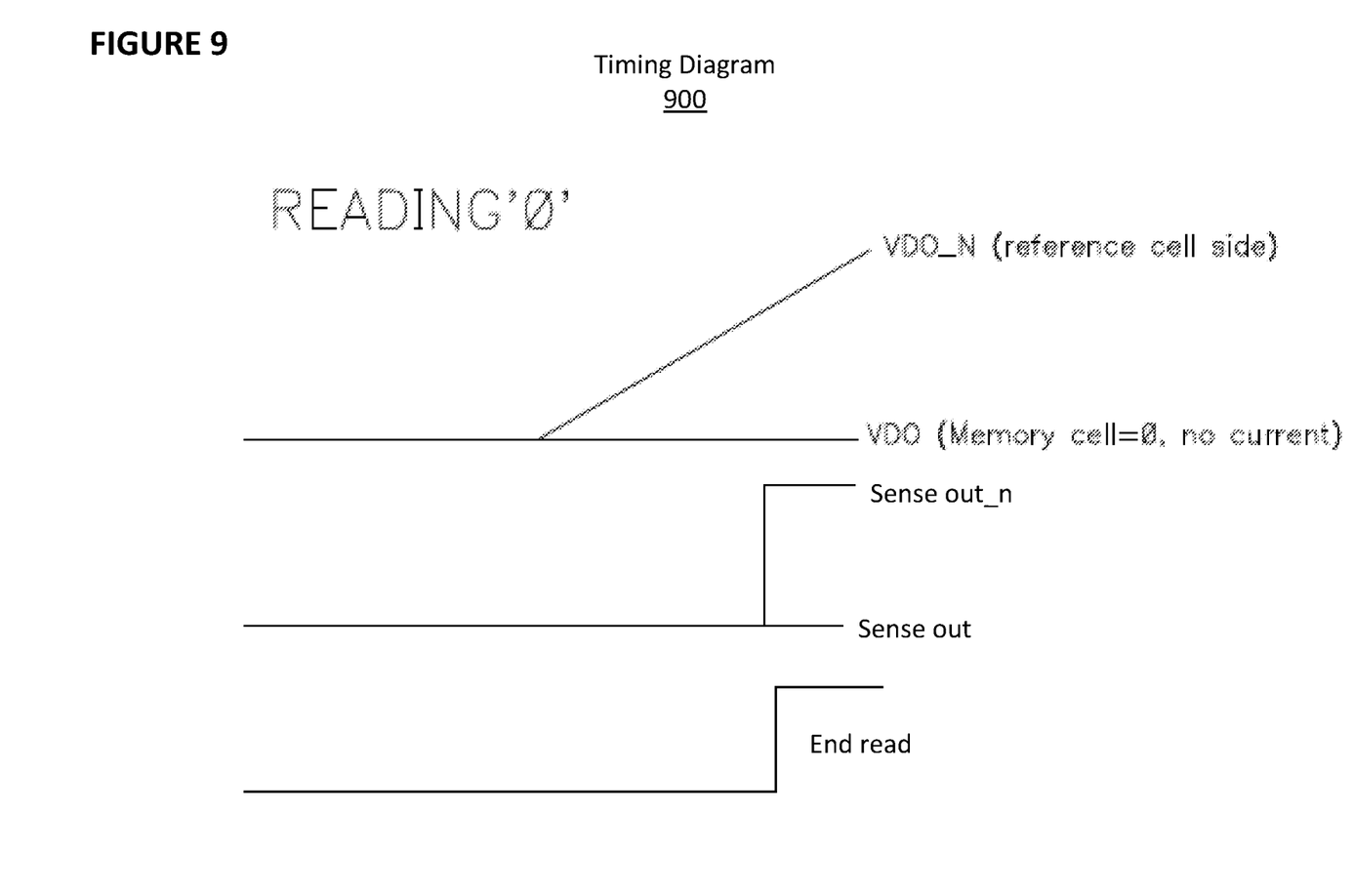
FIG. 9 depicts another timing diagram of the system of FIGS. 6A, 6B, and 7.

FIG. 7 depicts an implementation of a XOR logic function. XOR logic 700 is an embodiment of self-timer 205. XOR logic 700 comprises inverter 701 and multiplexor 702. Inverter 701 and multiplexor 702 each receives Sense out as an input. Multiplexor 702 also receives the inverter output (which will be the inverse of Sense_out) as an input. Sense out_n from comparator 600 controls multiplexor 702, and multiplexor 702 outputs the control signal End read. Control signal End_read will equal 1 when Sense out and Sense out_n are stable, different values. That is, only if Sense out and Sense out_n are opposite in phase for a time long enough to propagate through XOR logic 700 will the XOR output be a stable "1." XOR logic is preferred so as to reject an error conditions where both Sense out and Sense out_n are both high or are both low. This is depicted in FIG. 8 in timing diagram 800 for the situation where selected memory cell 409 contains a "1" and in FIG. 9 as timing diagram 900 for the situation where selected memory cell 409 contains a "0". End read is a control signal that is asserted by self-timer 205 when the read operation is stable and the data from sensing circuitry 202 can be accurately latched by data latch 204 for output.

The control signal End read can be sent to data latch 204 in FIG. 2 to latch the final output signal, Data out. The control signal End read is further fed to read control logic 203, and in response read control logic 203 disables signal SA_EN (shown as low), disabling sensing circuitry 202.

Thus, unlike in prior art memory system 100, the read timing of memory system 200 is self-defined so that data can be output from the read circuitry as soon as the read data is stable. Unlike in the prior art, a timing margin does not need to be added to each read operation, which makes the read operation much faster. Power consumption is minimized since the sense amplifiers are shut off whenever the read is completed. Test time is reduced, since there is no need to perform die-by-die trimming of the read timings during manufacturing.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A memory system comprising:
   a memory array;
   a read control logic for outputting a sense enable signal to initiate a read operation of a selected memory cell in the memory array;
   a sensing circuitry coupled to the memory array for outputting in response to the sense enable signal a sense output based on a value stored in the selected memory cell and a complement of the sense output;
   a self-timer for receiving the sense output and the complement of the sense output and for asserting a control signal when the sense output and the complement of the sense output are different values, wherein the self-timer comprises an XOR circuit that receives as inputs the sense output and the complement of the sense output and generates the control signal; and
   a data latch for latching the sense output in response to the control signal to generate a data output, wherein the data output is the value stored in the selected memory cell.

2. The memory system of claim 1, wherein the sensing circuitry comprises a current-to-voltage circuit and a comparator.

3. The memory system of claim 2, wherein prior to the read operation, the sense output is equal to the complement of the sense output.

4. The memory system of claim 1, wherein prior to the read operation, the sense output is equal to the complement of the sense output.

5. A method of reading a selected cell in a memory array, the method comprising:
   initiating a read operation of the selected cell by outputting an enable signal;
   in response to the enable signal, generating a sense output based on a value stored in the selected cell and generating a complement of the sense output;
   asserting a control signal in response to the sense output and the complement of the sense output being of different values, wherein the control signal is asserted by an XOR circuit that receives as inputs the generated sense output and the generated complement of the sense output; and
   latching the sense output in response to the control signal to generate a data output, wherein the data output is the value stored in the selected cell.

6. The method of claim 5, wherein the generating of the sense output is performed by a sensing circuit comprising a current-to-voltage circuit and a comparator.

7. The method of claim 6, wherein prior to the initiating step, the sense output is set to equal the complement of the sense output.

8. The method of claim 5, wherein prior to the initiating of the read operation, the sense output is set to be equal to the complement of the sense output.

* * * * *